(12) United States Patent
Sonoda et al.

(10) Patent No.: US 7,026,683 B2
(45) Date of Patent: Apr. 11, 2006

(54) NONVOLATILE SEMICONDUCTOR MEMORY DEVICE HAVING GROOVES ISOLATING THE FLOATING ELECTRODES OF MEMORY CELLS AND METHOD OF MANUFACTURING THE NONVOLATILE SEMICONDUCTOR MEMORY DEVICE

(75) Inventors: Masahisa Sonoda, Yokkaichi (JP); Hiroaki Tsunoda, Yokkaichi (JP); Seiichi Mori, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/642,666

(22) Filed: Aug. 19, 2003

(65) Prior Publication Data

US 2004/0201058 A1 Oct. 14, 2004

(30) Foreign Application Priority Data

Apr. 11, 2003 (JP) ............................. 2003-107991

(51) Int. Cl.
*H01L 29/788* (2006.01)
*H01L 29/792* (2006.01)

(52) U.S. Cl. ................ 257/315; 257/316; 257/324

(58) Field of Classification Search ................ 257/314, 257/315, 316, 324; 438/258
See application file for complete search history.

(56) References Cited

U.S. PATENT DOCUMENTS

| 4,935,378 A | 6/1990 | Mori |
| 5,869,858 A | 2/1999 | Ozawa et al. |
| 6,680,230 B1 * | 1/2004 | Arai et al. .................. 438/258 |

FOREIGN PATENT DOCUMENTS

| JP | 63-252482 | 10/1988 |
| JP | 03-41987 | 6/1991 |
| JP | 5 304302 | 11/1993 |
| JP | 6-29553 | 2/1994 |
| JP | 11-260938 | 9/1999 |
| JP | 2001-110919 | 4/2001 |
| JP | 2002-16154 | 1/2002 |
| JP | 2002 270705 | 9/2002 |
| JP | 2002-533931 | 10/2002 |

OTHER PUBLICATIONS

Notification of Reasons for Rejection dated May 10, 2005, issued by the Japanese Patent Office in counterpart Japanese Application No. 2003-107991 and English language translation thereof.

Decision of Rejection dated Dec. 6, 2005, issued by the Japanese Patent Office in counterpart Japanese Application No. 2003-107991, and English language translation thereof.

* cited by examiner

*Primary Examiner*—Steven Loke
(74) *Attorney, Agent, or Firm*—Finnegan, Henderson, Farabow, Garrett & Dunner, L.L.P.

(57) ABSTRACT

A plurality of nonvolatile memory elements formed on element regions respectively isolated by element isolation regions on a main surface of a first conductive type semiconductor substrate, the nonvolatile semiconductor memory elements comprising a gate insulating film formed on the main surface of the semiconductor substrate, a plurality of floating electrodes formed along a first direction on the gate insulating film, a plurality of grooves formed among the plurality of floating electrodes, groove insulating films filled in the plurality of the grooves, a second conductive type impurity diffusion region formed along a second direction so as to sandwich the floating electrodes, interelectrode insulating films formed along the first direction on the plurality of floating electrodes and the groove insulating films, and control electrodes formed on the interelectrode insulating films.

4 Claims, 12 Drawing Sheets

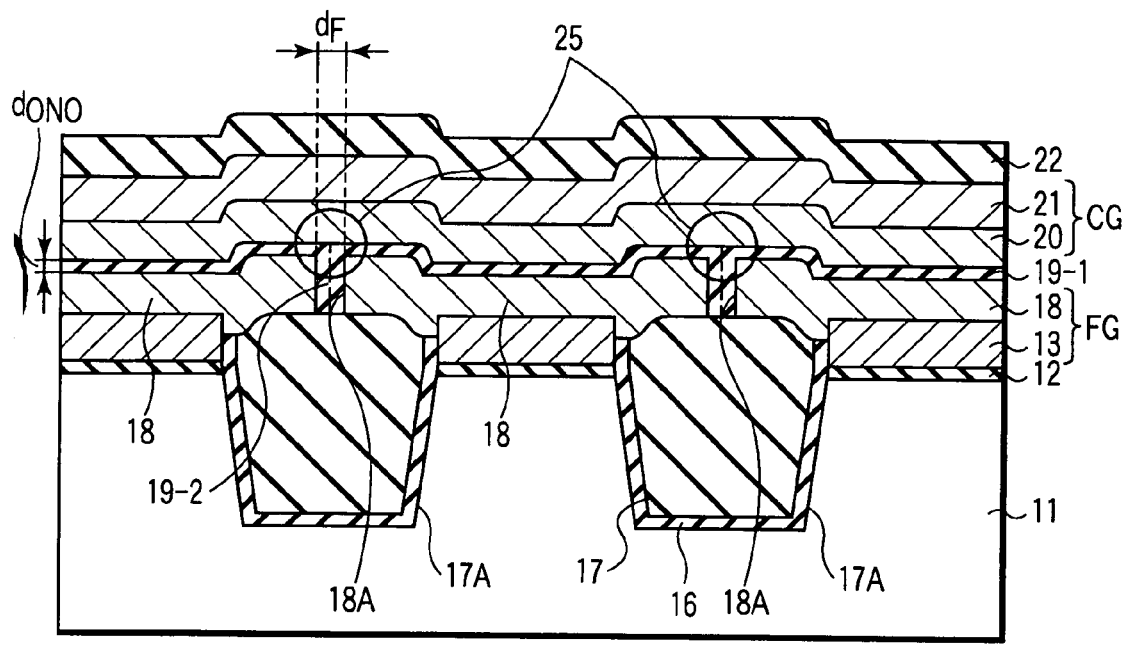
F I G. 1
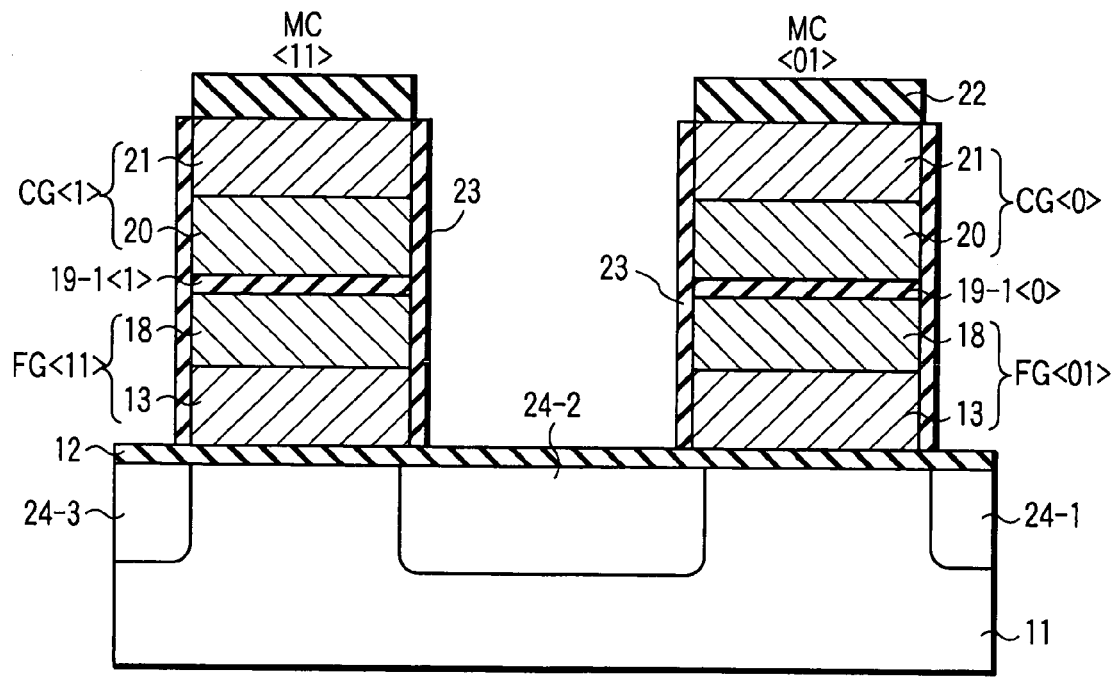
F I G. 2

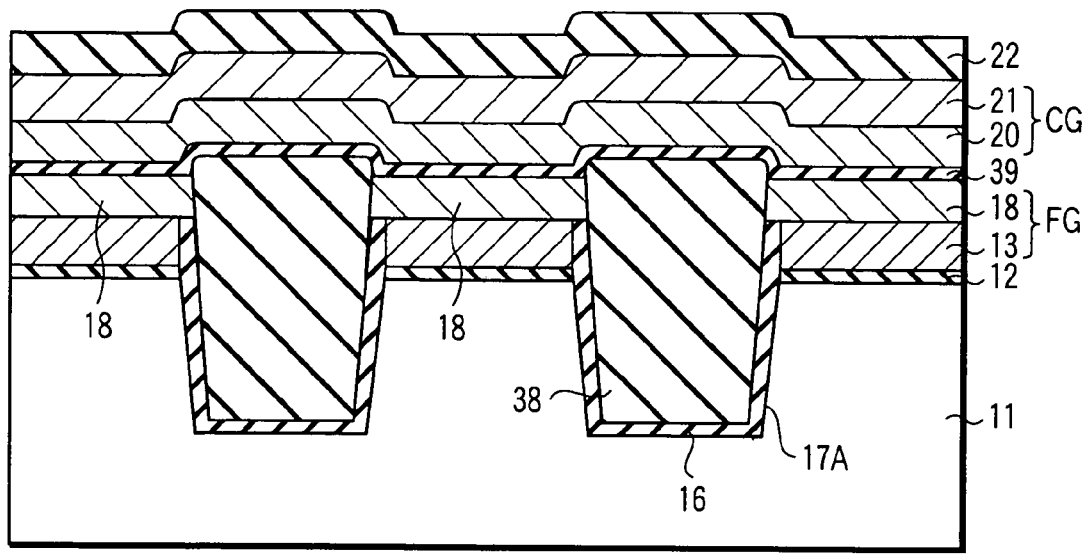
F I G. 15

NONVOLATILE SEMICONDUCTOR MEMORY DEVICE HAVING GROOVES ISOLATING THE FLOATING ELECTRODES OF MEMORY CELLS AND METHOD OF MANUFACTURING THE NONVOLATILE SEMICONDUCTOR MEMORY DEVICE

CROSS-REFERENCE TO RELATED APPLICATIONS

This application is based upon and claims the benefit of priority from the prior Japanese Patent Application No. 2003-107991, filed Apr. 11, 2003, the entire contents of which are incorporated herein by reference.

BACKGROUND OF THE INVENTION

1. Field of the Invention

The present invention relates to a nonvolatile semiconductor memory device and a method of manufacturing the same, and more specifically, is applied to a nonvolatile semiconductor memory device having grooves insulated by insulating films between floating electrodes of adjacent nonvolatile memory elements, and to a method of manufacturing the same.

2. Description of the Related Art

As a conventional nonvolatile semiconductor memory device having floating electrodes, there is a device as shown in FIG. 17 (for example, Jpn. Pat. Appln. KOKAI Publication No. P2002-016154). The nonvolatile semiconductor memory device shown in FIG. 17 comprises a silicon substrate 111, a gate oxide film 112, a first polycrystalline silicon film 113 which is a lower layer floating electrode, a silicon oxide film 116, a silicon oxide film 117 which is an STI filling material for an element isolation region, a second polycrystalline silicon film 118 which is an upper layer floating electrode, an ONO insulating film (a three-layer film of a silicon oxide film, a silicon nitride film, and a silicon oxide film) 119, a third polycrystalline silicon film 120 which is a lower layer control electrode, a WSi film 121 which is an upper layer control electrode, and a silicon oxide film 122 which is an insulating protective film.

The first polycrystalline silicon film 113 which is the lower layer floating electrode is insulated from the lower floating electrode, to which a cell which is adjacent thereto corresponds, by the silicon oxide films 116, 117 at the element isolation region. The second polycrystalline silicon film 118 which is the upper layer floating electrode is isolated from the upper floating electrode, to which a cell which is adjacent thereto corresponds, by a groove 126 on the silicon oxide film 117. The floating electrode 118 and the control electrode 120 are isolated by the ONO insulating film 119 which is an interelectrode insulating film.

However, the conventional nonvolatile semiconductor memory device is structured such that the control electrode 120 along with the ONO insulating film 119 enters the interior of the groove 126 between the adjacent cells at this floating electrode corner portion 125.

Therefore, electric fields converge at the floating electrode corner portion 125, and the insulating characteristic of the ONO insulating film 119 at this corner portion 125 deteriorates. Thus, there is the problem that the characteristic of maintaining the electric charges injected in the floating electrodes 113, 118 in accordance with stored information is poor.

BRIEF SUMMARY OF THE INVENTION

According to an aspect of the present invention, there is provided a nonvolatile semiconductor memory device comprising:
a plurality of nonvolatile memory elements formed on element regions respectively isolated by element isolation regions on a main surface of a first conductive type semiconductor substrate;
the nonvolatile semiconductor memory elements comprising:
a gate insulating film formed on the main surface of the semiconductor substrate;
a plurality of floating electrodes formed along a first direction on the gate insulating film;
a plurality of grooves formed among said plurality of floating electrodes;
groove insulating films filled in said plurality of grooves;
a second conductive type impurity diffusion region formed along a second direction so as to sandwich the floating electrodes;
interelectrode insulating films formed along the first direction on the plurality of floating electrodes and the groove insulating films; and
control electrodes formed on the interelectrode insulating films, and wherein a width of the groove is less than or equal to 1.6 times a film thickness of the interelectrode insulating film.

BRIEF DESCRIPTION OF THE SEVERAL VIEWS OF THE DRAWING

FIG. 1 is a cross-sectional structural view in which a cross-sectional structure of a nonvolatile semiconductor memory device having floating electrodes according to a first embodiment of the present invention is cut along line 1—1 of FIG. 3, and is viewed in the direction of the arrow;

FIG. 2 is a cross-sectional structural view in which a cross-sectional structure of the nonvolatile semiconductor memory device having the floating electrodes according to the first embodiment of the present invention is cut along line 2—2 of FIG. 3, and is viewed in the direction of the arrow;

FIG. 15 is a cross-sectional structural view of a nonvolatile semiconductor memory device having floating electrodes according to a sixth embodiment of the present invention;

DETAILED DESCRIPTION OF THE INVENTION

Figure 3:
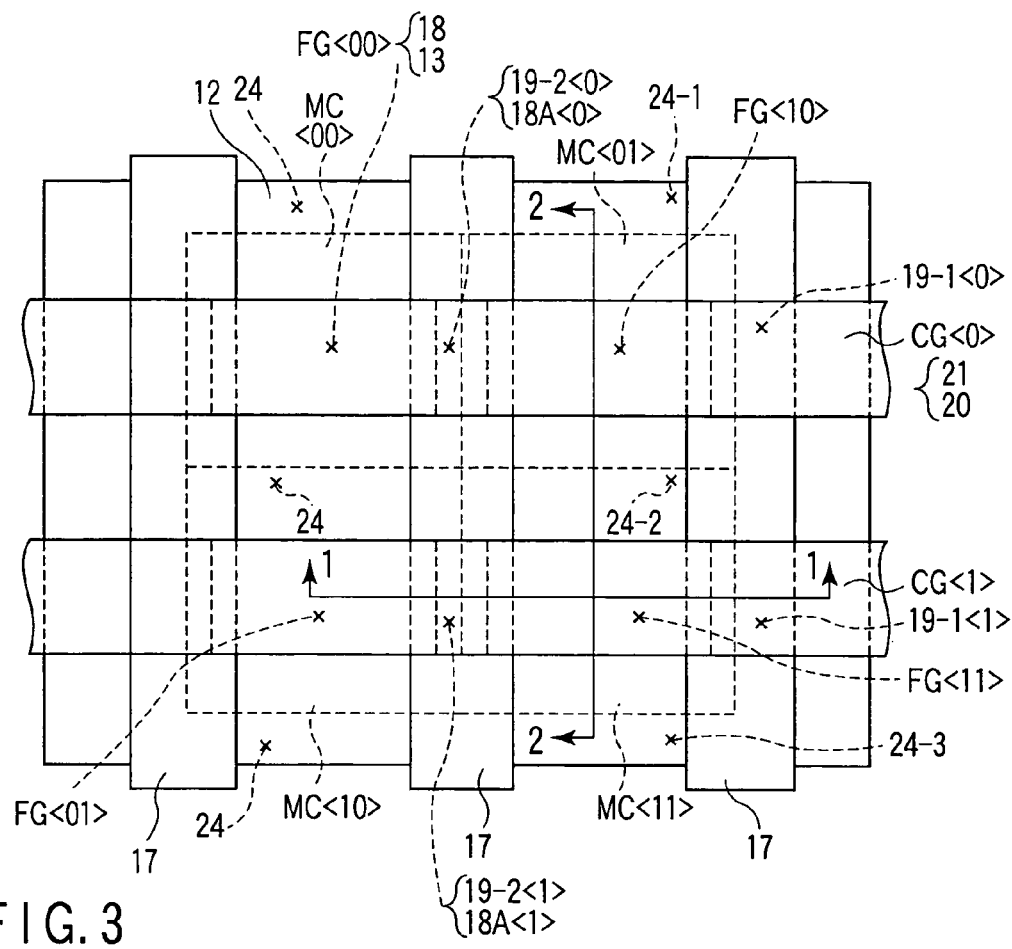
FIG. 3 is a plan view schematically showing a layout of the nonvolatile semiconductor memory device having the floating electrodes according to the first embodiment of the present invention.

Hereinafter, embodiments in which the present invention is applied to a nonvolatile semiconductor memory device which is formed on the main surface of a silicon substrate and which has floating electrodes will be described with reference to the drawings. Note that, in this description, portions which are common to all drawings are denoted by common reference numerals.

FIRST EMBODIMENT

Hereinafter, a nonvolatile semiconductor memory device having floating electrodes according to a first embodiment of the present invention will be described by using FIGS. 1 to 3. Here, FIG. 1 is a cross-sectional structural view in which the plan view of FIG. 3 is cut along line 1—1 and which is viewed in the direction of the arrow. FIG. 2 is a cross-sectional structural view in which the plan view of FIG. 3 is cut along line 2—2 and which is viewed in the direction of the arrow. FIG. 3 is a plan view of the nonvolatile semiconductor memory device according to the first embodiment of the present invention.

As shown in FIG. 1, a silicon oxide film 12 which will be a gate insulating film and a polycrystalline silicon film 13 which will be a first floating electrode layer are successively laminated in a state of being isolated by a silicon oxide film 16 formed in the interior of an STI groove 17A forming an element isolation region. A silicon oxide film 17 which is an STI filling material is filled in the interior of the STI groove 17A surrounded by the silicon oxide film 16.

A polycrystalline silicon film 18 is formed as a second floating electrode layer on the polycrystalline silicon film 13. The polycrystalline silicon film 18 is isolated by a groove 18A at a substantially central portion of the top surface of the silicon oxide film 17 which is the STI filling material. In the groove 18A and on the polycrystalline silicon oxide film 18 which will be the second floating electrode film, an ONO insulating film (formed of three layers of a silicon oxide film, a silicon nitride film, and a silicon oxide film) 19-1 is deposited as an interelectrode insulating film.

On the ONO insulating film 19-1, a polycrystalline silicon film 20 which will be a first control electrode layer and a WSi film 21 which will be a second control electrode layer are successively formed. As shown in FIG. 3, control electrodes CG<0>, CG<1> are formed by these first and second control electrode layers 20, 21.

As shown in FIGS. 2 and 3, on the main surface of the silicon substrate 11, the silicon oxide film 12 which will be the gate insulating film and the polycrystalline silicon film 13 which will be the first floating electrode layer are formed at the element region isolated by the silicon oxide film 17. In the interior of the silicon substrate 11 beneath the silicon oxide film 12, impurity diffusion layers 24-1, 24-2, 24-3 which will be source regions/drain regions are formed so as to extend between the adjacent polycrystalline silicon films 13.

The polycrystalline silicon film 18 is formed on the polycrystalline silicon film 13 as the second floating electrode layer. On this polycrystalline silicon film 18, the ONO insulating film (formed of three layers of a silicon oxide film, a silicon nitride film, and a silicon oxide film) 19-1 is deposited as an interelectrode insulating film. The polycrystalline silicon film 13 and polycrystalline silicon film 18 respectively structure two-layer structure floating electrodes FG<01>, FG<11> at nonvolatile memory elements MC<01>, MC<11> which are adjacent to one another.

The polycrystalline silicon film 20 which will be the first control electrode layer and the WSi film 21 which will be the second control electrode layer are successively formed on the ONO insulating film 19-1. In the same way, the control electrodes CG<0>, CG<1> of the adjacent two nonvolatile memory elements MC<01>, MC<11> are formed by these first and second control electrode layers 20, 21. A gate wall insulating film 23 is formed at the side faces of the nonvolatile memory elements MC<01> to MC<11> having them, and silicon oxide films 22 are respectively formed on the top surfaces thereof.

Here, a plan view layout of the nonvolatile semiconductor memory device of the embodiment having the cross-sectional structure shown in FIGS. 1 and 2 will be described with reference to the plan view of FIG. 3. Namely, the nonvolatile semiconductor memory device, which has the plurality of nonvolatile memory elements MC<00> to MC<11> formed along the control electrodes CG<0> and CG<1> at the element forming region isolated by the silicon oxide film 17 (STI filling material) which is the element isolation film at the silicon substrate 11, is formed. Here, MC is a nonvolatile memory element, CG is a control electrode, FG is a floating electrode, and <nm> (nm: integer) expresses <row, column> in a matrix-form array. In FIG. 3, <nm> shows the four nonvolatile memory elements MC<00> to MC<11>.

Further, the silicon oxide film 12 which is the gate insulating film is formed on the silicon substrate 11. The impurity diffusion layers 24-1, 24-2, 24-3, which are to be the sources and the drains, are formed in a direction intersecting the control electrodes CG<0> and CG<1> so as to extend between the floating electrodes FG of the adjacent nonvolatile memory elements beneath the silicon oxide film 12. Moreover, the nonvolatile memory elements MC<00> to MC<11> respectively have the floating electrodes FG<00> to FG<11>, and the control electrodes CG<0> and CG<1>.

The floating electrodes FG<00> to FG<11> are respectively formed within the regions of the nonvolatile memory elements MC<00> to MC<11>, and are formed of the polycrystalline silicon film 13 and the polycrystalline silicon film 18 on the silicon oxide film 12 which is the gate insulating film.

Further, ONO insulating films 19-1<0> and 19-1<1> which will be the interelectrode insulating films are formed between the floating electrodes FG<00> to FG<11> and the control electrodes CG<0> and CG<1>.

On the other hand, the control electrode CG is structured from the polycrystalline silicon film 20 and the WSi film 21. Namely, the control electrode CG<0> is formed above the floating electrodes FG<00> and FG<01> via the interelectrode insulating film 19-1<0>. In the same way, the control electrode CG<1> is formed above the floating electrodes FG<10> and FG<1> via the interelectrode insulating film 19-1<1>.

Further, the space between the floating electrodes FG<00> and FG<01> which are adjacent along the control electrode CG<0> serves as a groove 18A<0>. In the same way, the space between the floating electrodes FG<10> and FG<11> which are adjacent along the control electrode CG<1> serves as a groove 18A<1>.

As shown in FIG. 1, the ONO insulating film 19-2 is formed in the interior of the groove 18A, and is formed so as to completely bury the groove 18A which is between the floating electrodes 18 adjacent along the control electrode CG. For example, the ONO insulating film 19-2<0> is formed in the interior of the groove 18A<0>, and in the same way, the ONO insulating film 19-2<1> is formed in the interior of the groove 18A<1>.

By using the structure described above, the interelectrode insulating film ONO insulating film 19-1 completely enters and fills in the interior of the groove 18A. Accordingly, there is no case in which the control electrode CG formed above the interelectrode insulating film ONO insulating film 19-1 enters the interior of the groove 18A.

Next, with respect to operations of the respective elements, an example of the nonvolatile memory element MC<11> will be described.

The writing operation will be described. First, the silicon substrate 11 is made to have ground potential. Further, a high voltage is applied between the impurity diffusion layer 24-2 and the impurity diffusion layer 24-3 which are to be the source and drain regions. For example, given that the impurity diffusion layer 24-2 is a source region and the impurity diffusion layer 24-3 is a drain region, ground potential is applied to the impurity diffusion layer 24-2 which is the source region, and a predetermined high potential is applied to the impurity diffusion layer 24-3 which is the drain region.

Further, when the high potential is applied to the control electrode CG<1>, a hot electron generated by the high electric potential applied between the source and the drain, i.e., the impurity diffusion layers 24-2 and 24-3 is injected in the floating electrode FG<11>. Or, FN current is generated by the high voltage of the control electrode CG<1>, and electrons are injected in the floating electrode FG<11>.

In this way, the nonvolatile memory element MC<11> is selectively written. Further, the electrons injected in the floating electrode FG<11> are maintained as is. Therefore, written information is maintained without a rewriting operation.

Next, reading operations will be described. First, the silicon substrate 11 is made to have ground potential. Further, the impurity diffusion layer 24-2 which will be the source region is made to have ground potential. Moreover, an electric potential is applied to the impurity diffusion layer 24-3 which will be the drain region. Next, a voltage is applied to the control electrode CG<1>. At this time, assuming that electrons are injected in the floating electrode <11> of the nonvolatile memory element MC<11>, it is difficult for a channel to be formed between the source and the drain, and the threshold voltage becomes high. Namely, the memory element MC<11> is in the OFF-state, and current does not flow between the impurity diffusion layers 24-2 and 24-3 which are the source and the drain.

On the other hand, supposing that electrons are not injected in the floating electrode <11>, a channel is easily formed between the source and the drain, and current flows therebetween, and the memory element MC<11> becomes the ON-state. In this way, information written in the memory element MC<11> is read by reading the presence/absence of current at the drain region of the nonvolatile memory element MC<11>, i.e., the impurity diffusion layer 24-3, by a sense amplifier (not shown) or the like which is connected thereto.

Next, the erasing operation will be described. The erasing operation is batch-erasing with respect to all of the nonvolatile memory elements MC<00> to MC<11>. Namely, a positive potential is applied to the impurity diffusion layer 24 which is all of the drain regions and the source regions. Moreover, a negative potential is applied to all of the control electrodes CG<0> and CG<1>. As a result, the hold electrons are extracted from all of the floating electrodes FG<00> to FG<11>, and stored information of the nonvolatile memory elements MC<00> to MC<11> is erased. The above operations are in the same for the other the nonvolatile memory elements MC<00>, MC<01> as well, and MC<10>.

As described above, in the interior of the groove 18A which will be the groove of the floating electrode FG which is adjacent along the control electrode CG, the ONO insulating film 19-2 is formed so as to completely embed the groove. By using the structure as described above, the interelectrode insulating film ONO insulating film 19-1 completely enters the interior of the groove 18A, and the groove 18A is filled up. Accordingly, there is no case in which the control electrode CG formed above the interelectrode insulating film ONO insulating film 19-1 enters the interior of the groove 18A. In accordance therewith, it is possible to eliminate cases in which the electrons injected in the floating electrode FG after the writing operation leak out to the control electrode CG due to the electric field convergence of a floating electrode corner portion 25. Namely, the electric charge maintaining characteristic can be improved.

In this way, in accordance with this embodiment, regardless of how wide the groove 18A is, the control electrode 20 does not hang down within the groove 18A as in the prior art. Therefore, the occurrence of the convergence of electric fields with the floating electrode 18 can be prevented in advance. Accordingly, the electric charge maintaining characteristic of the nonvolatile memory element is markedly improved.

Further, in the embodiment shown in FIGS. 1 to 3, the device can be manufactured by a method in which the groove insulating film 19-2 filled-in the groove 18A is formed first, and thereafter, the interelectrode insulating film 19-1 formed between the floating electrode 18 and the control electrode 20 is deposited. However, when the groove insulating film 19-2 and the interelectrode insulating film 19-1 are formed of the same ONO films, it is possible to form both simultaneously.

On the other hand, the width of the groove 18A is a factor determining the interval between the two nonvolatile memory elements. If an attempt is made to dispose the nonvolatile memory elements at a high density in a limited area, the width of the groove 18A becomes narrow of necessity.

In such a case, in order to sufficiently exhibit the effects of the present embodiment, it is preferable that the width dF of the groove 18A and the film thickness dONO of the interelectrode insulating film 19-1 satisfy the following conditions. Those conditions will be described by using FIG. 4.

Figure 4:
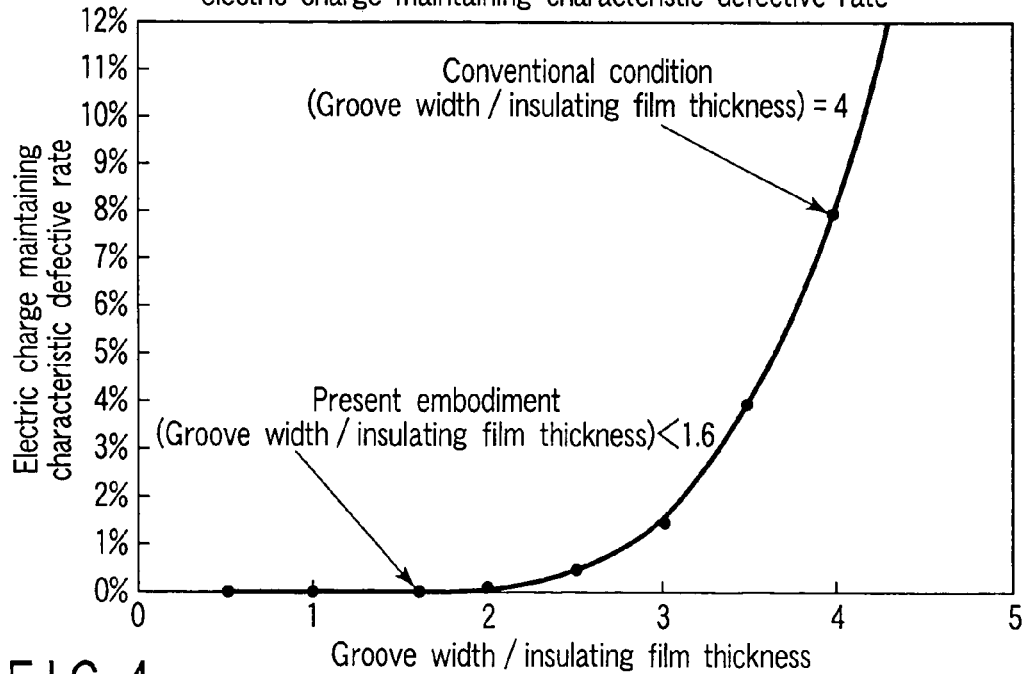
FIG. 4 is a graph showing the groove width/film thickness dependency of an electric charge maintaining characteristic defective rate according to the first embodiment of the present invention.

FIG. 4 is a graph expressing the dependency of the groove width dF/the film thickness dONO with respect to an electric charge maintaining characteristic defective rate. Here, the groove width dF is the interval of the groove 18A between the adjacent floating electrodes 18, and the film thickness dONO is the film thickness of the interelectrode insulating film 19-1 deposited between the polycrystalline silicon film 20 and the polycrystalline silicon film 18.

Figure 17:
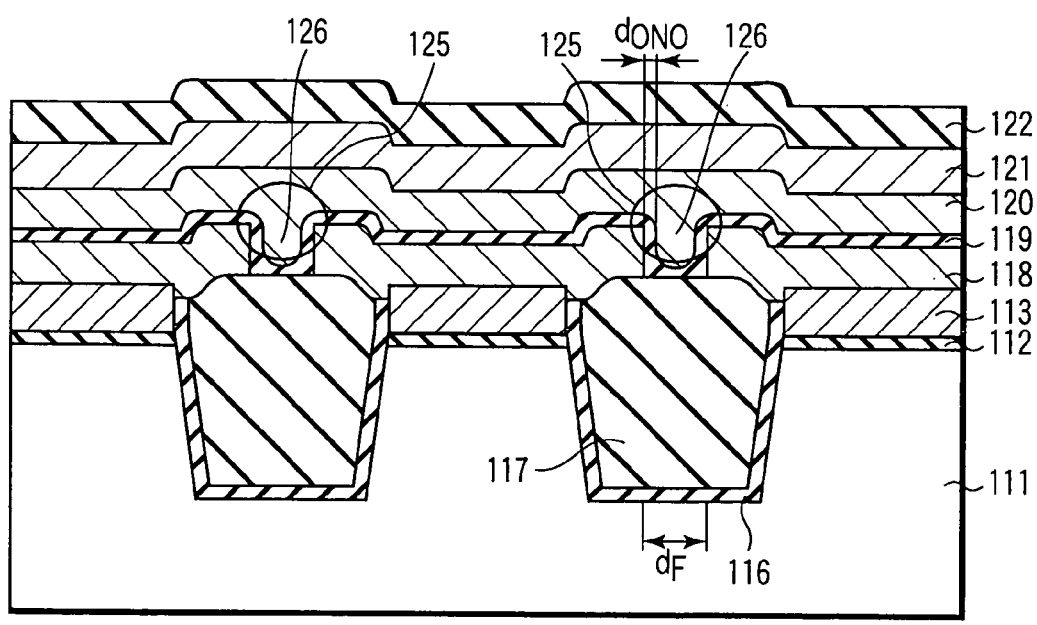
FIG. 17 is a cross-sectional structural view of a conventional nonvolatile semiconductor memory device having floating electrodes according to the prior art.

As shown in FIG. 4, for example, in a conventional nonvolatile semiconductor memory element having a structure as shown in FIG. 17, groove width dF/film thickness dONO=about 4. Accordingly, an electric charge maintaining characteristic defective rate of about 8% arises.

On the other hand, in the present embodiment, when the groove insulating film 19-2 and the interelectrode insulating film 19-1 are deposited by using the same materials at one time, it can be understood from FIG. 4 that it is preferable that groove width dF/film thickness dONO<1.6. In this case, the electric charge maintaining characteristic defective rate becomes substantially 0%, and an extremely fine electric charge maintaining characteristic is shown.

The relationship shown by the inequality groove width dF/film thickness dONO<1.6 is a condition in which the groove 18A having the groove width dF can be filled with the same insulating film by using an insulating film having the film thickness dONO.

Namely, the film thickness in the groove width direction deposited in the groove 18A generally depends on the type of the deposited insulating film. This is because the film thickness in the groove width direction deposited in the groove 18A becomes about 1.6 times the film thickness dONO which is the interelectrode film insulating film 19-1 deposited between the floating electrode 18 and the control electrode 20. The reason for this is that the film thickness of the inter-groove insulating film 19-2 deposited at the side surface of the floating electrode 18 is about 0.8 times the film thickness of the interelectrode insulating film 19-1 deposited between the polycrystalline silicon film 18 and the polycrystalline silicon film 20.

On the other hand, when the interelectrode insulating film 19-1 is deposited at the side surface of the groove 18A in an ideal state, because the film thickness becomes the same as the thickness deposited on the top surface of the floating electrode layer 18, it can be considered that the groove width dF becomes about 2.0 times the film thickness dONO. However, when the interelectrode insulating film 19-1 is actually deposited under this condition, the groove is not completely filled up, and a slight cavity arises on the surface of the interelectrode insulating film 19-1. As a result, the control electrode enters the interior of the groove 18A as in the prior art, and electric field convergence arises at the floating electrode corner portion. As a result, the problem of deterioration of the electric charge maintaining characteristic due to electric field convergence cannot be solved.

However, when the floating groove width dF is less than 1.6 times the film thickness dONO, the interior of the groove 18A is completely filled with, for example, the ONO insulating film 19, and the control electrode 20 entering the groove 18A can be completely avoided. As a result, the control electrode 20 does not cover the floating electrode corner portion 25, and the device becomes a structure in which it is difficult for electric field convergence to arise, and the electric charge maintaining characteristic is improved.

Moreover, by satisfying this condition, the effect that dispersion of the distribution of the threshold value of each cell, i.e., each nonvolatile memory element, is suppressed, can be anticipated. Namely, because the radius of curvature of the floating electrode corner portion at the side facing the control electrode differs for each cell, if the corner portion is used for holding electric charges, the speed of writing/erasing varies for each cell. Therefore, dispersion of the threshold distribution of the respective cells arises. However, in the present embodiment, the reason for this is that dispersion among cells is reduced because the floating electrode corner portion 25 is not used for maintaining electric charges, and only the flat insulating film is used for writing/erasing.

Note that, in the present embodiment, a case in which the ONO insulating film is used as the interelectrode film and the inter-groove insulating film is shown. However, provided that it is an insulating film, the same effects can be obtained even if, for example, another insulating film such as an oxide film, a silicon nitride film, or the like is used.

Hereinafter, an example of the manufacturing process of the nonvolatile semiconductor memory device of the embodiment shown in FIGS. 1 to 3 will be described with reference to FIGS. 5A to 5D, and 6A to 6E.

Figure 5A:
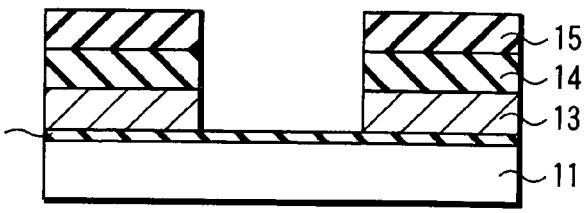
FIG. 5A is a first process view for explanation, with respect to the cross-sectional structure shown in FIG. 1, of one example of a method of manufacturing the nonvolatile semiconductor memory device according to the first embodiment of the present invention.
Figure 6A:
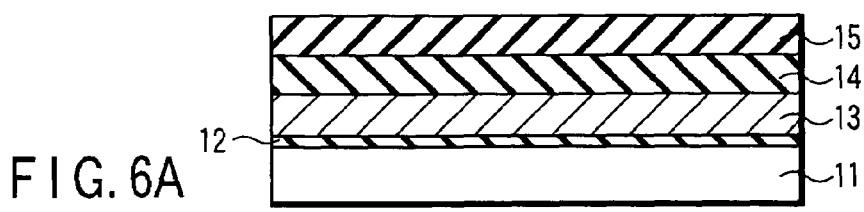
FIG. 6A is a first process view for explanation, with respect to the cross-sectional structure shown in FIG. 2, of one example of the method of manufacturing the nonvolatile semiconductor memory device according to the first embodiment of the present invention.

First, in FIGS. 5A and 6A, the silicon oxide film 12 is formed so as to have a thickness of about 10 nm by being heated in, for example, an $O_2$ atmosphere to 800° C., on the main surface of the silicon substrate 11. Next, for example, by a low pressure CVD method, the polycrystalline silicon film 13 of about 60 nm which will be floating electrode, a silicon nitride film 14 of about 100 nm, and a silicon oxide film 15 of about 150 nm are deposited. Next, a desired pattern is formed by using a photoresist by normal light etching, and the silicon oxide film 15 and the silicon nitride film 14 are processed by using the pattern as a mask by an RIE method. Next, the silicon substrate is exposed to $O_2$ plasma, and the photoresist is eliminated, and the polycrystalline silicon film 13 is processed by using the silicon oxide film 15 as a mask.

Figure 5B:
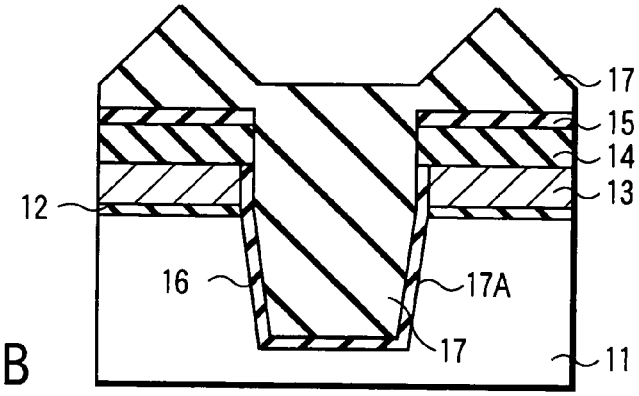
FIG. 5B is a second process view for explanation, with respect to the cross-sectional structure shown in FIG. 1, of one example of the method of manufacturing the nonvolatile semiconductor memory device according to the first embodiment of the present invention.
Figure 6B:
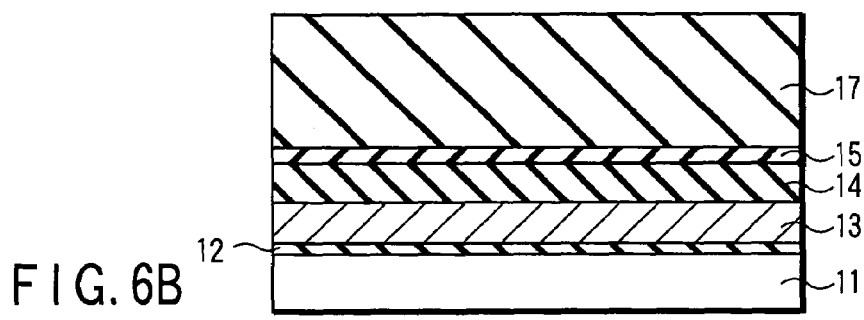
FIG. 6B is a second process view for explanation, with respect to the cross-sectional structure shown in FIG. 2, of one example of the method of manufacturing the nonvolatile semiconductor memory device according to the first embodiment of the present invention.

Next, in FIGS. 5B and 6B, the silicon oxide film 12 and the silicon substrate 11 are processed by using the silicon oxide film 15 as a mask, and the groove 17A is formed in the silicon substrate 11. Next, by heating in an $O_2$ atmosphere to about 1000° C., the silicon oxide film 16 of about 6 nm is formed at the external wall of the groove 17A. Next, the silicon oxide film 17 of about 600 nm which will be the STI filling material is deposited by an HDP (high density plasma) method.

Figure 5C:
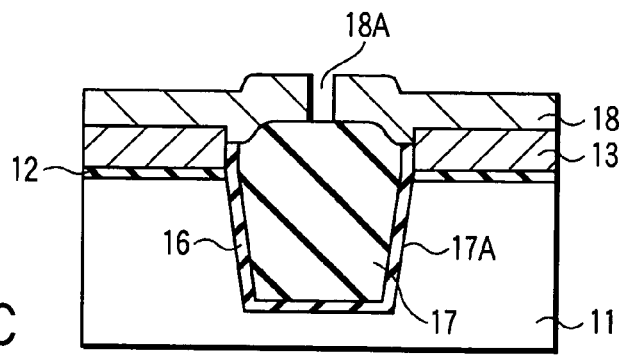
FIG. 5C is a third process view for explanation, with respect to the cross-sectional structure shown in FIG. 1, of one example of the method of manufacturing the nonvolatile semiconductor memory device according to the first embodiment of the present invention.
Figure 6C:
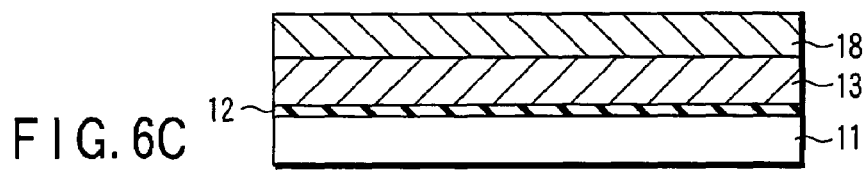
FIG. 6C is a third process view for explanation, with respect to the cross-sectional structure shown in FIG. 2, of one example of the method of manufacturing the nonvolatile semiconductor memory device according to the first embodiment of the present invention.

Next, in FIGS. 5C and 6C, the silicon oxide film 17 is flattened by a CMP (chemical mechanical polishing) method, and is heated in a nitrogen atmosphere to about 900° C. Moreover, the structure is immersed for about 10 sec in a buffered HF solution, and the silicon nitride film 14 is eliminated by phosphating at about 150° C. Next, the silicon oxide film 17 is etched at about 20 nm by a dilute HF solution.

Moreover, the polycrystalline silicon film 18 which is made to be a floating electrode due to phosphorus being added by the low pressure CVD method is deposited. Further, the polycrystalline silicon film 18 is processed by the RIE method by using the mask of the photoresist at the substantially central portion of the top surface of the silicon oxide film 17, and the groove 18A is formed.

Figure 5D:
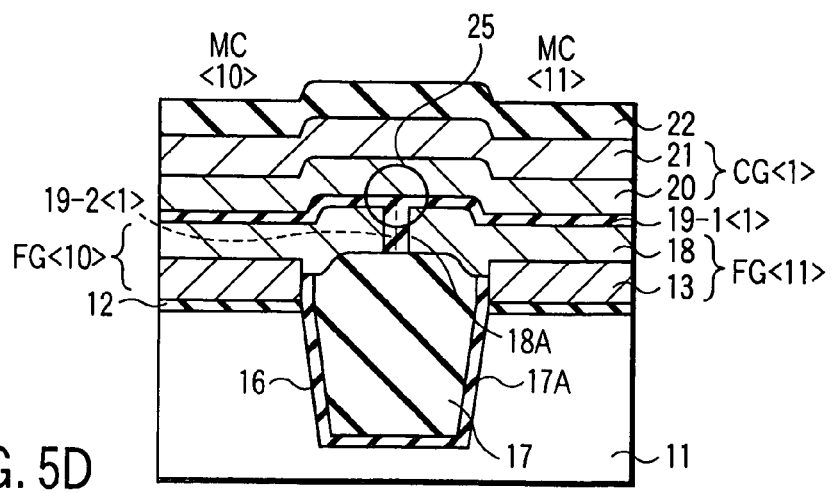
FIG. 5D is a fourth process view for explanation, with respect to the cross-sectional structure shown in FIG. 1, of one example of the method of manufacturing the nonvolatile semiconductor memory device according to the first embodiment of the present invention.
Figure 6D:
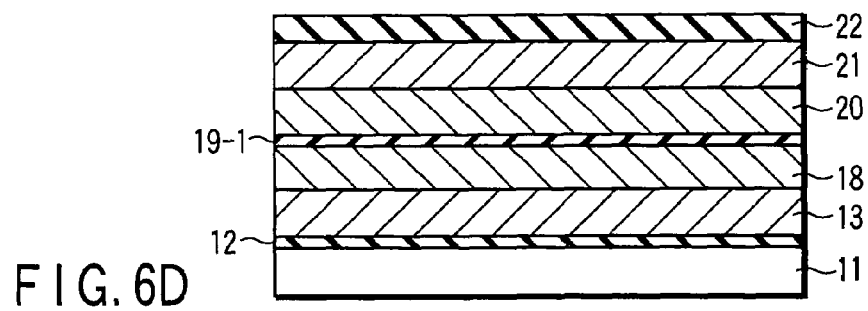
FIG. 6D is a fourth process view for explanation, with respect to the cross-sectional structure shown in FIG. 2, of one example of the method of manufacturing the nonvolatile semiconductor memory device according to the first embodiment of the present invention.

Moreover, in FIGS. 5D and 6D, the ONO insulating films 19-1 and 19-2 (three-layer films of a silicon oxide film of about 5 nm, a silicon nitride film of about 5 nm, and a silicon oxide film of about 5 nm), the polycrystalline silicon film 20 of about 100 nm which will be the control electrode and to which phosphorus is added, the WSi film 21 of about 100 nm, and the silicon oxide film 22 of about 200 nm are deposited by the low pressure CVD method. Next, the photoresist is patterned in a desired form by a photolithography method, and the silicon oxide film 22 is processed by using the patterned photoresist as a mask by, for example, the RIE method.

Figure 6E:
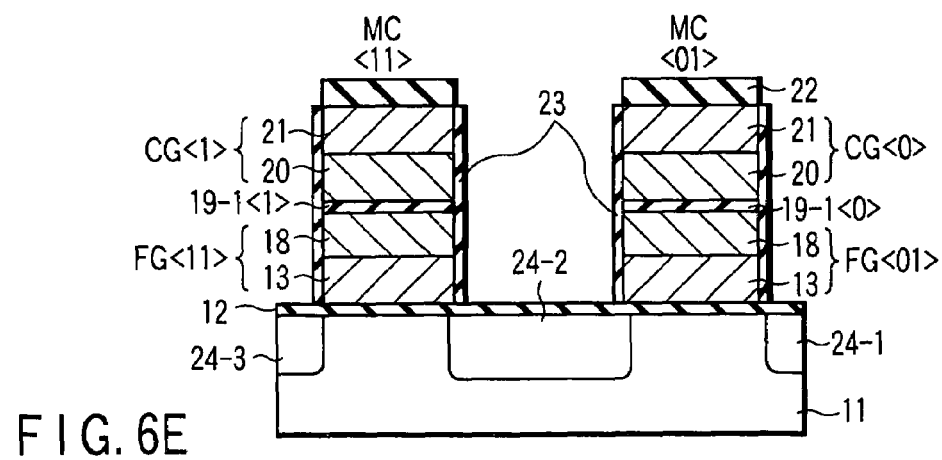
FIG. 6E is a fifth process view for explanation, with respect to the cross-sectional structure shown in FIG. 2, of one example of the method of manufacturing the nonvolatile semiconductor memory device according to the first embodiment of the present invention.

Next, in FIG. 6E, by using the silicon oxide film 22 as a mask, the WSi film 21, the polycrystalline silicon film 20, the ONO insulating films 19-1 and 19-2, the polycrystalline silicon film 18, the polycrystalline silicon film 13 are successively processed by, for example, the RIE method. Moreover, the impurity diffusion layers 24-1, 24-2, and 24-3 which will be the source/drain regions are formed in a self-aligned manner by using the processed control electrode and the aforementioned pattern of the silicon oxide film 17 which will be the STI filling material as masks. Moreover, silicon oxide films 23 are formed at the side walls of the respective nonvolatile memory elements MC by heating in an $O_2$ atmosphere to about 1000° C.

In accordance with the above-described manufacturing processes, the nonvolatile memory elements MC<00> to MC<11> are formed.

As shown in FIG. SD, the interior of the groove 18A<1> between the floating electrodes is filled with the ONO insulating film 19-2<1>. Therefore, the device is structured such that the polycrystalline silicon film 20 and the WSi film 21 structuring the control electrode CG<1> cannot enter the interior of the groove 18A<1>. Thus, electric field convergence at the floating electrode corner portion 25 does not arise, and the electric charge maintaining characteristic is improved.

Further, the manufacturing method according to the present embodiment is a process in which the ONO insulating film 19-1 which is the interelectrode insulating film of the control electrodes CG<0>, CG<1> and the floating electrodes FG<00> to FG<11>, and the ONO insulating film 19-2 which is the groove insulating film filled in the groove 18A<0> and groove 18A<1> use the same insulating film, and are simultaneously deposited. At this time, the groove width dF and the film thickness dONO are formed so as to satisfy the relational expression shown in this embodiment, which is groove width dF/film thickness dONO<1.6.

Therefore, because the interiors of the groove 18A<0> and the groove 18A<1> can be filled with the insulating film 19-2, electric field convergence does not arise with respect to the control electrode at the floating electrode corner portion 25. Accordingly, the electric charge maintaining characteristic is improved, and the electric charge maintaining defective rate can be made to be substantially 0%.

Further, because the interval between the electrodes and the groove can be filled by using the same insulating film in this way, the manufacturing costs can be reduced, and the manufacturing speed can be improved.

As described above, this is a process in which the groove insulating films filled in the interelectrode insulating film and the groove are manufactured at one time by using the same insulating film. However, in order to fill the groove 18A<0> and the groove 18A<1>, it is possible that an insulating film such as an oxide film, a silicon nitride film, or the like is deposited first, and the entire surface thereof is etched by the RIE method, or the insulating films other than an inter floating electrode film are eliminated by the CMP method, and thereafter, the interelectrode insulating films of the control electrodes CG<0>, CG<1> and the floating electrodes FG<00> to FG<11> are deposited by using an insulating film different therefrom.

In this way, when the interelectrode film and the groove insulating film are deposited in separate processes, the electric charge maintaining ratio is not reduced even when there is a the large groove width which does not satisfy the relational expression of the groove width dF and the film thickness dONO between the electrodes shown in the above-described embodiment. In this way, in the process in which the insulating films are separately deposited, because the interiors of the groove 18A<0> and the groove 18A<1> can be completely filled with the insulating films regardless of the widths of the grooves, the control electrode does not enter the grooves, and electric field convergence does not arise at the floating electrode corner portion 25 facing the control electrode. Therefore, the electric charge maintaining characteristic can be improved.

SECOND EMBODIMENT

A second embodiment according to the present invention will be described by using FIGS. 7, and 8A to 8C. In the descriptions of the following embodiments, descriptions of portions which are the same as in the first embodiment will-be omitted.

Figure 7:
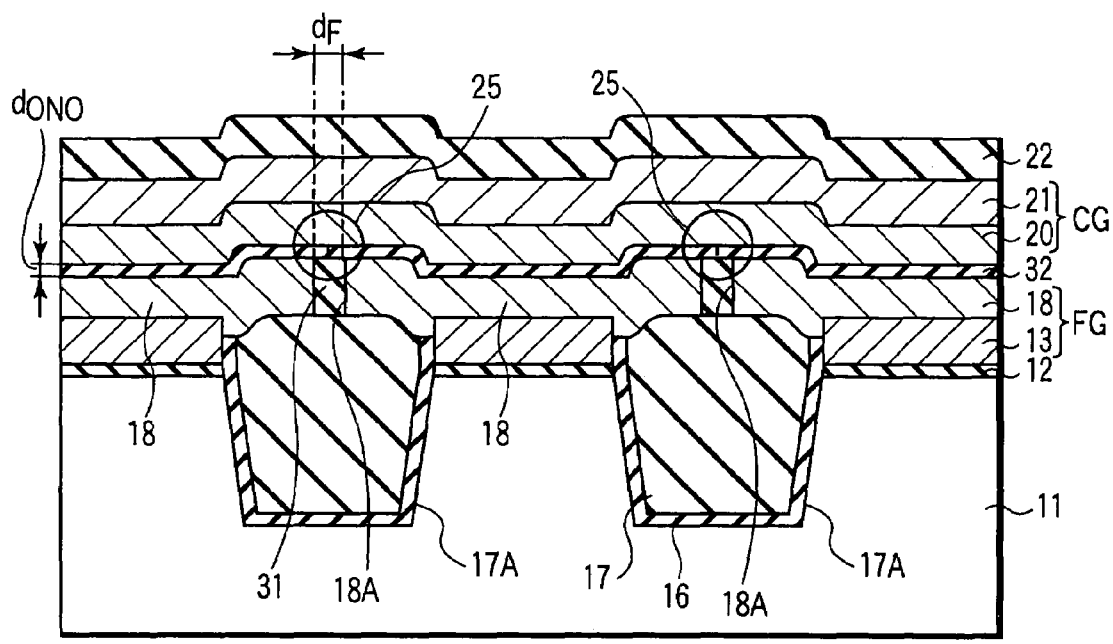
FIG. 7 is a cross-sectional structural view of a nonvolatile semiconductor memory device having floating electrodes according to a second embodiment of the present invention.
Figure 8A:
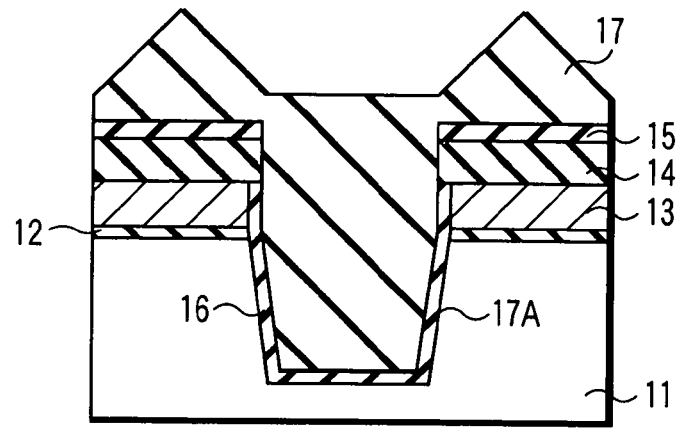
FIG. 8A is a first process view for explanation, with respect to the cross-sectional structure shown in FIG. 7, of one example of a method of manufacturing the nonvolatile semiconductor memory device according to the second embodiment of the present invention.
Figure 8B:
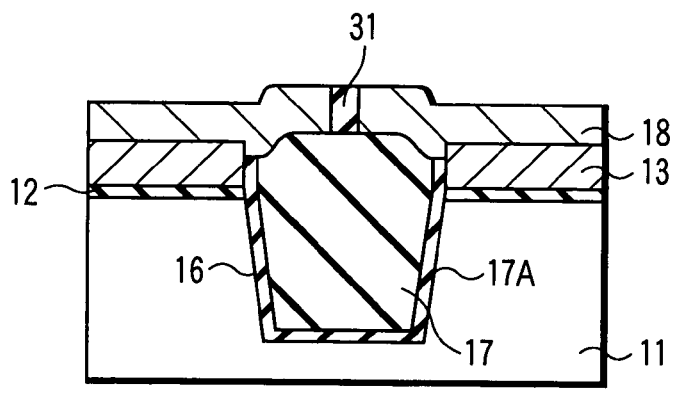
FIG. 8B is a second process view for explanation, with respect to the cross-sectional structure shown in FIG. 7, of one example of the method of manufacturing the nonvolatile semiconductor memory device according to the second embodiment of the present invention.
Figure 8C:
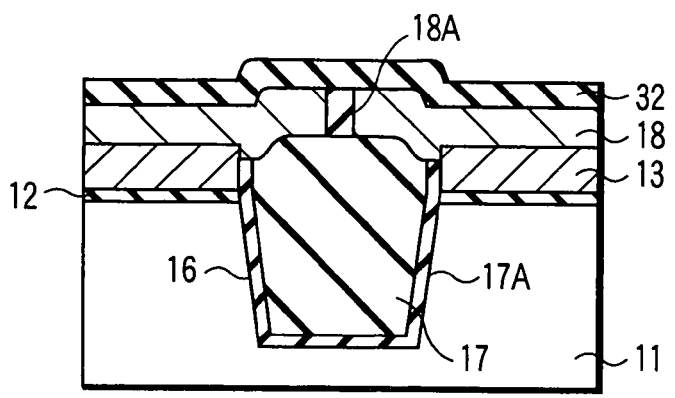
FIG. 8C is a third process view for explanation, with respect to the cross-sectional structure shown in FIG. 7, of one example of the method of manufacturing the nonvolatile semiconductor memory device according to the second embodiment of the present invention.

FIG. 7 is a cross-sectional structural view of the plurality of nonvolatile semiconductor memory device formed along the wiring longitudinal direction of the control electrodes CG (the polycrystalline silicon film 20 and the WSi film 21) so as to correspond to FIG. 1. FIGS. 8A to 8C are process views for explanation of one example of the method of manufacturing the nonvolatile semiconductor memory device shown in FIG. 7.

As shown in FIG. 7, the groove 18A whose groove width dF is, for example, about 80 nm is formed at the substantially central portion of the top surface of the silicon oxide film 17 which is the STI filling material. The silicon oxide film 31 having a low dielectric constant is formed at the interior of the groove 18A.

An alumina ($Al_2O_3$) film 32 is formed along the longitudinal direction of the control electrode CG between the polycrystalline silicon film 18 and the polycrystalline silicon film 20. The alumina film 32 is an insulating material having a dielectric constant which is higher than at least the dielectric constant of the silicon oxide film 31 having the above-described low dielectric constant.

In this way, in the present embodiment, the insulating film formed in the interior of the groove 18A and the insulating film formed between the floating electrode FG and the control electrode CG are formed of different materials, and are formed such that the dielectric constants of the respective insulating films differ from one another.

First, due to the insulating film formed in the interior of the groove 18A and the insulating film formed between the floating electrode FG and the control electrode CG being separately formed, even if the groove width is broad, the interior of the groove 18A can be completely filled with the insulating film. Therefore, the control electrodes CG do not enter the interior of the groove 18A. As a result, in the same way as in the first embodiment, convergence of the electric field at the floating electrode corner portion 25 can be avoided, and the electric charge maintaining characteristic can be improved.

Furthermore, the dielectric constants of the respective insulating films are formed so as to differ from each other. Namely, the silicon oxide film 31 which is an insulating material whose dielectric constant is low is formed so as to be filled in the groove 18A. Therefore, a data interference effect due to the capacitive coupling between the floating electrodes FG which are adjacent along the control electrodes CG can be suppressed to a minimum. Here, the data interference effect due to the capacitive coupling between the floating electrodes FG means the effect in which the threshold voltages of the adjacent floating electrodes FG are affected in accordance with the electrical states of the floating electrodes FG. For example, it means that the threshold voltages of the adjacent floating electrodes FG are affected in accordance with whether electrons are injected in the floating electrodes FG or not. Accordingly, when the effect is large, the ability to control the threshold voltages of the respective nonvolatile memory elements MC deteriorates. However, the silicon oxide film 31 which is an insulating material whose dielectric constant is low is filled in the groove 18A. Therefore, the electrical effect between the adjacent floating electrodes FG can be suppressed to a minimum. As a result, the above-described data interference effect can be suppressed to a minimum, and the reliabilities of the respective nonvolatile memory elements MC can be improved.

Moreover, the insulating film formed between the polycrystalline silicon film 18 and the polycrystalline silicon film 20 is formed of the alumina film 32 which is an insulating material whose dielectric constant is high. Accordingly, the capacitive coupling between the floating electrode FG and the control electrode CG becomes high. As a result, the control voltage at the time of writing and reading which is applied to the control electrode CG can be reduced.

Note that the aforementioned groove insulating film formed in the interior of the groove 18A is preferably an insulating material whose dielectric constant is as low as possible. Accordingly, the groove insulating film is preferably formed of a silicon oxide film formed by being deposited, for example, by the coating method, or the like, more than a silicon oxide film formed by normal thermal oxidation. However, if the material is a material whose dielectric constant is low, the embodiment is not limited to the silicon insulating film 31, and other insulating materials can be applied to the present embodiment.

As the insulating material formed between the polycrystalline silicon film 20 and the polycrystalline silicon film 18, in addition to the $Al_2O_3$ (alumina) film 32, for example, $Ta_2O_5$ (tantalum oxide) film and the like can be applied to the invention. In consideration of the fact that the device must have a sufficient insulation performance in order for the electric charges of the floating electrode FG to not leak, the $Al_2O_3$ (alumina) film 32 is more preferable in the present technique. Moreover, in consideration of the fact that it suffices for the insulating material to be a high dielectric constant film and for the leakage current to be less than or equal to a given value, for example, a silicon nitride film or the like as well can be applied to the present embodiment. In this case, a silicon nitride film using a depositing method in which there igroovetle leakage current using, for example, the JVD (jet vapor deposition) method, or the like, is applied to the present embodiment. Further, as compared with a case in which these single-layer films whose dielectric constants are high are used, a multi-layer structure film such as an ONO insulating film (oxide film/nitride film/oxide film) or the like can be used, although the capacitive coupling between the floating electrode FG and the control electrode CG becomes small.

Hereinafter, one example of the method of manufacturing the nonvolatile semiconductor memory device shown in FIG. 7 will be described by using FIGS. 8A to 8C.

First, in FIG. 8A, the silicon oxide film 12, the polycrystalline silicon film 13, the silicon nitride film 14, the silicon oxide film 15, the silicon oxide film 16, and the silicon oxide film 17 which is the STI filling material are formed on the main surface of the silicon substrate 11 by the same method as in the first embodiment.

Next, in FIG. 8B, the polycrystalline silicon film 18, which is made to be the floating electrode due to phosphorus being added by the low pressure CVD method, is deposited. Moreover, the polycrystalline silicon film 18 is processed by using the mask of the photoresist by the RIE method, and the groove 18A is formed at the substantially central portion of the top surface of the silicon oxide film 17. At this time, the groove width of the groove 18A is, for example, about 80 nm. Moreover, the silicon oxide film 31 having a low dielectric constant is formed in the interior of the groove 18A by using, for example, a coating method.

Subsequently, in FIG. 8C, the alumina film 32 is formed by, for example, the CVD method. Thereafter, the nonvolatile semiconductor memory device shown in FIG. 7 can be formed by the same manufacturing processes as in the first embodiment.

THIRD EMBODIMENT

A third embodiment according to the present invention will be described by using FIGS. 9, and 10A to 10C.

Figure 9:
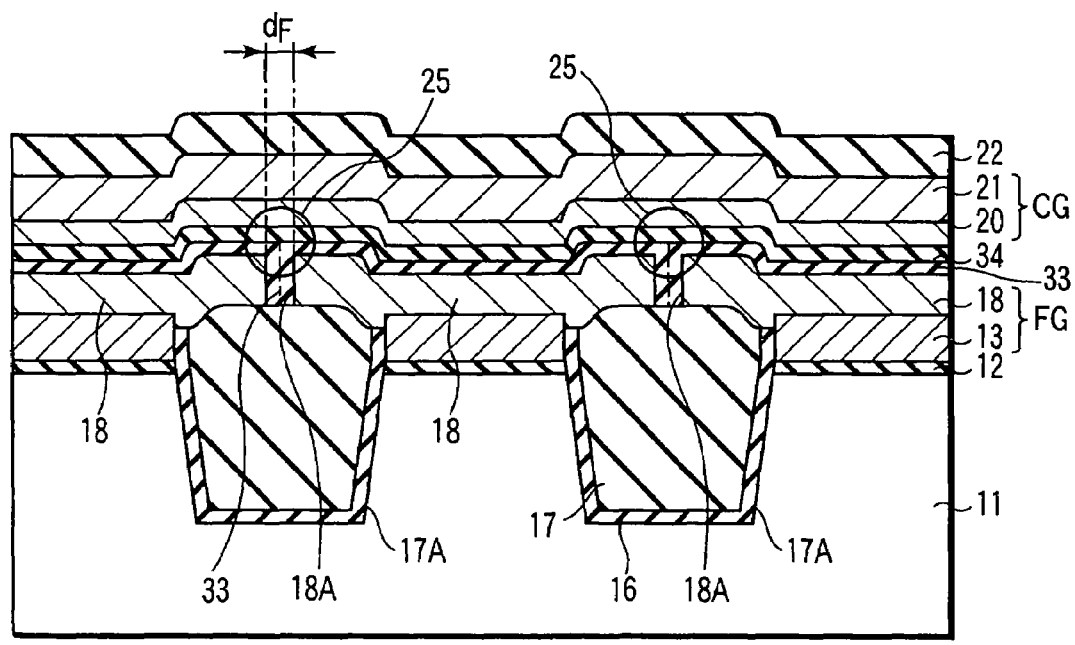
FIG. 9 is a cross-sectional structural view of a nonvolatile semiconductor memory device having floating electrodes according to a third embodiment of the present invention.
Figure 10A:
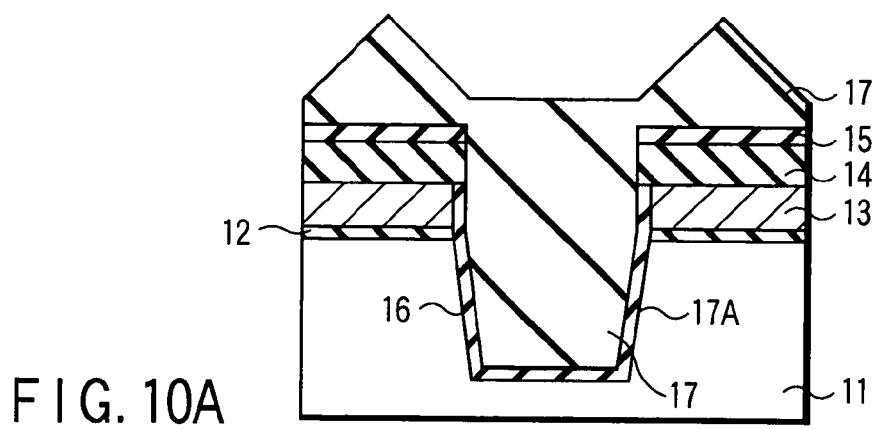
FIG. 10A is a first process view for explanation, with respect to the cross-sectional structure shown in FIG. 9, of one example of a method of manufacturing the nonvolatile semiconductor memory device according to the third embodiment of the present invention.
Figure 10B:
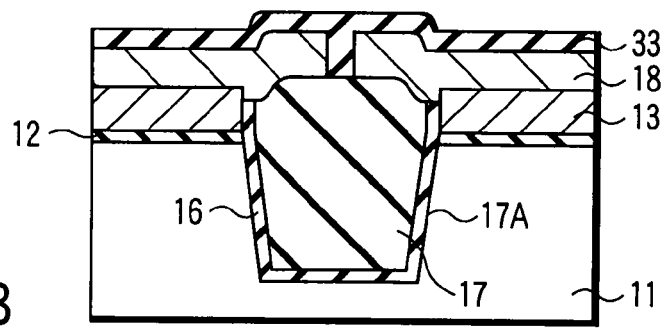
FIG. 10B is a second process view for explanation, with respect to the cross-sectional structure shown in FIG. 9, of one example of the method of manufacturing the nonvolatile semiconductor memory device according to the third embodiment of the present invention.
Figure 10C:
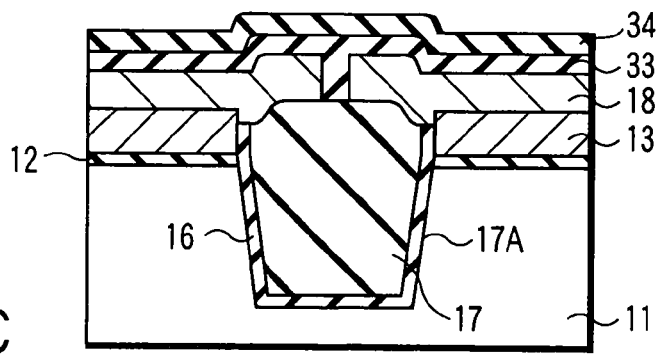
FIG. 10C is a third process view for explanation, with respect to the cross-sectional structure shown in FIG. 9, of one example of the method of manufacturing the nonvolatile semiconductor memory device according to the third embodiment of the present invention.

FIG. 9 is a cross-sectional structural view of the plurality of nonvolatile semiconductor memory device formed along the wiring longitudinal direction of the control electrodes CG. FIGS. 10A to 10C are process views for explanation of one example of the method of manufacturing the nonvolatile semiconductor memory device shown in FIG. 9.

As shown in FIG. 9, the groove 18A whose groove width dF is, for example, about 10 nm is formed at the substantially central portion of the top surface of the silicon oxide film 17 which is the STI filling material. A silicon oxide film 33 having a low dielectric constant is formed in the interior of the groove 18A. Moreover, the same silicon oxide film 33 is formed so as to have a thin film thickness between the polycrystalline silicon film 20 and the polycrystalline silicon film 18, and both are formed so as to be integrated. Here, the film thickness of the silicon oxide film 33 formed between the polycrystalline silicon film 20 and the polycrystalline silicon film 18 is, for example, about 5 to 6 nm.

An alumina film 34 is formed on the top surface of the above-described silicon oxide film 33. In the same way as described above, the alumina film 34 is an insulating material having a high dielectric constant.

The silicon oxide film 33 is formed so as to have a thin film thickness in the interior of the groove 18A and between the polycrystalline silicon film 20 and the polycrystalline silicon film 18, and both are formed so as to be integrated. In this way, the interior of the groove 18A is filled with the silicon oxide film 33 which is an insulating film whose dielectric constant is low. As a result, the electric charge maintaining characteristic can be improved, and the data interference effect between the above-described floating electrodes FG can be reduced to a minimum.

The low dielectric constant silicon oxide film 33 is formed so as to have a thin film thickness between the polycrystalline silicon film 20 and the polycrystalline silicon film 18 as well. As a result, convergence of the electric field at the floating electrode corner portion 25 can be avoided, and the electric charge maintaining characteristic can be improved more.

The alumina film 34 having a high dielectric constant is formed on the top surface of the above-described silicon oxide film 33 formed so as to be thin. As a result, due to the capacitive coupling between the floating electrode FG and the control electrode CG being made to be high, the control voltage applied to the control electrode CG at the time of writing and reading can be reduced.

Furthermore, the film thickness of the silicon oxide film 33 formed between the polycrystalline silicon film 20 and the polycrystalline silicon film 18 is formed so as to be thinner than the film thickness of the alumina film 34. As a result, the above-described effect for reducing the operational voltage and the above-described effect for improving the electric charge maintaining characteristic can be achieved together.

Moreover, the film thickness of the silicon oxide film 33 formed between the polycrystalline silicon film 20 and the polycrystalline silicon film 18 is, for example, about 5 to 6 nm. Accordingly, even when the width dF of the groove 18A is an extremely small dimension which is, for example, about 10 nm, the interior of the groove 18A can be filled up. As a result, the nonvolatile memory elements can be arranged at a high density, and the electric charge maintaining characteristic is improved, so that the data interference effect between the adjacent floating electrodes FG can be reduced to a minimum. In this way, this is a structure which is effective for extremely small dimensions as well.

Note that, in the same way as described above, the silicon insulating film 33 is preferably an insulating material whose dielectric constant is as low as possible. A silicon oxide film formed by being deposited, for example, by the coating method, or the like, is applicable. Further, if the material is a material whose dielectric constant is low, other insulating materials are also applicable.

In the alumina film 34 formed on the top surface of the silicon oxide film 33 formed so as to be thin, in the same way, for example, a $Ta_2O_5$ (tantalum oxide) film, a silicon nitride film, an ONO insulating film, or the like can be used.

Hereinafter, one example of the method of manufacturing the nonvolatile semiconductor memory device shown in FIG. 9 will be described by using FIGS. 10A to 10C.

First, in FIG. 10A, by the same method as in the first embodiment, on the main surface of the silicon substrate 11, after the groove 17A which will be an element isolation region is formed, the silicon oxide film 12, the polycrystalline silicon film 13, the silicon nitride film 14, the silicon oxide film 15, the silicon oxide film 16, and the silicon oxide film 17 which is the STI filling material are successively formed.

Next, in FIG. 10B, the silicon oxide film 17 is flattened by the CMP method, and is heated in a nitrogen atmosphere to about 900° C. Further, the silicon oxide film 17 is immersed for about 10 sec in a buffered HF solution, and the silicon nitride film 14 is eliminated by phosphating at about 150° C. Next, the silicon oxide film 17 is etched at about 20 nm in a dilute HF solution. Moreover, the polycrystalline silicon film 18 which is made to be a floating electrode due to phosphorus being added by the low pressure CVD method is deposited. Furthermore, the polycrystalline silicon film 18 is processed by the RIE method by using a mask of a photoresist, and the groove 18A is formed at the substantially central portion of the top surface of the silicon oxide film 17. At this time, the groove width of the groove 18A is, for example, 10 nm. In addition, in the groove 18A and on the top surface of the polycrystalline silicon film 18, by using, for example, the CVD method, the silicon oxide film 33 having a low dielectric constant is formed simultaneously without the process for filling the in the groove 18A.

Next, in FIG. 10C, the alumina film 34 is formed by, for example, the CVD method. Therefore, the nonvolatile semiconductor memory device shown in FIG. 9 can be formed by the same manufacturing processes as in the first embodiment.

In the method of manufacturing according to the embodiment, by using, for example, the CVD method, the silicon oxide film 33 having a low dielectric constant is formed in the groove 18A and on the top surface of the polycrystalline silicon film 18, simultaneously with the filling in the groove 18A. Accordingly, the process of separately filling in the groove 18A can be omitted.

Note that, in the first to third embodiments, the floating electrodes FG are formed of the polycrystalline silicon film 13 and the polycrystalline silicon film 18 whose both ends project up to the grooves 18A on the silicon oxide film 17 formed on the top surface thereof. In this way, due to the polycrystalline silicon film 18 projecting up to the grooves 18A, the surface area facing the control electrode CG can be made to be large. As a result, the capacitive coupling ratio can be made large.

FOURTH EMBODIMENT

A fourth embodiment according to the present invention will be described by using FIG. 11, and FIGS. 12A to 12C.

Figure 11:
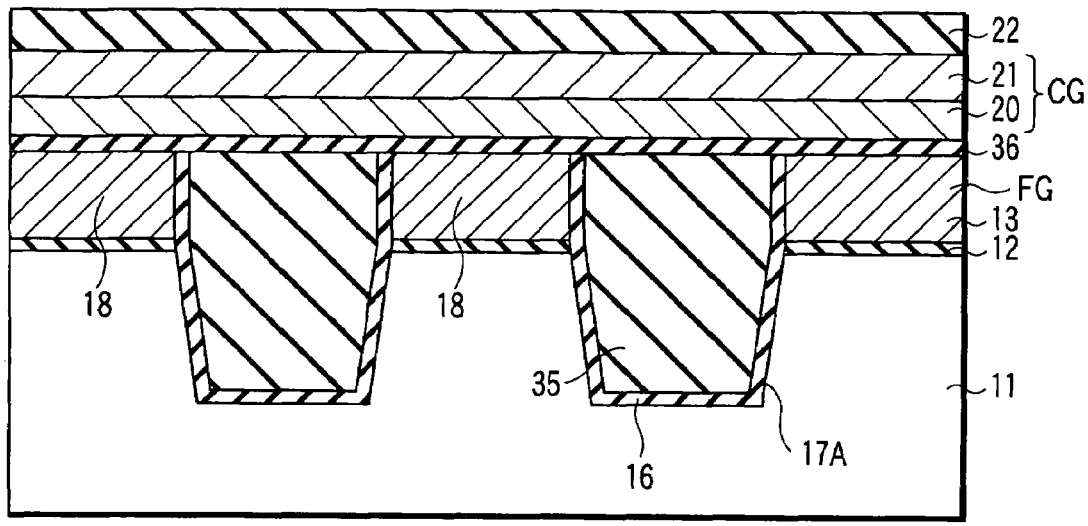
FIG. 11 is a cross-sectional structural view of a nonvolatile semiconductor memory device having floating electrodes according to a fourth embodiment of the present invention.
Figure 12A:
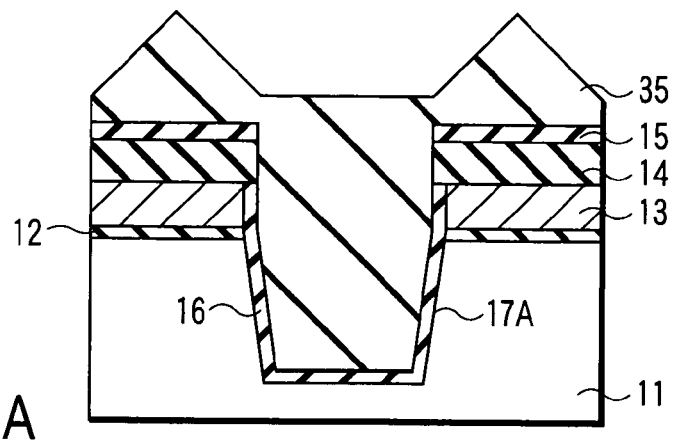
FIG. 12A is a first process view for explanation, with respect to the cross-sectional structure shown in FIG. 11, of one example of a method of manufacturing the nonvolatile semiconductor memory device according to the fourth embodiment of the present invention.
Figure 12B:
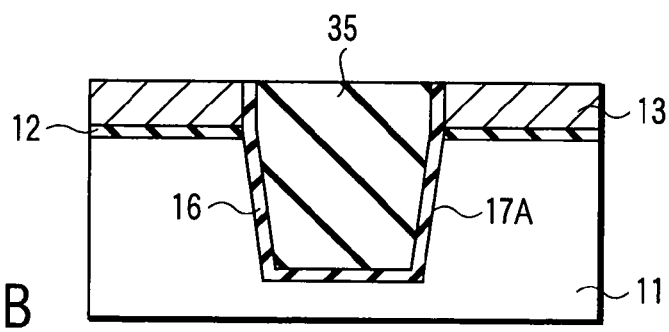
FIG. 12B is a second process view for explanation, with respect to the cross-sectional structure shown in FIG. 11, of one example of the method of manufacturing the nonvolatile semiconductor memory device according to the fourth embodiment of the present invention.
Figure 12C:
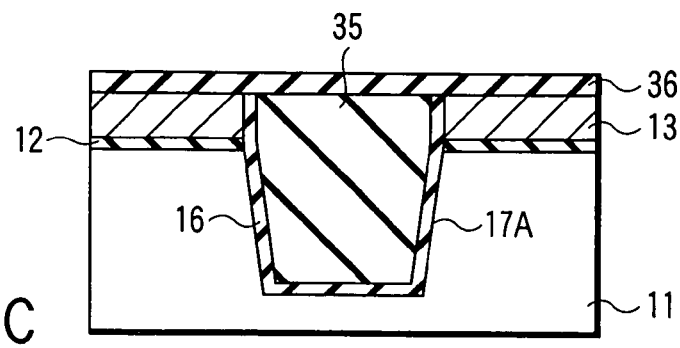
FIG. 12C is a third process view for explanation, with respect to the cross-sectional structure shown in FIG. 11, of one example of the method of manufacturing the nonvolatile semiconductor memory device according to the fourth embodiment of the present invention.

FIG. 11 is a cross-sectional structural view of the plurality of nonvolatile semiconductor memory device formed along the wiring longitudinal direction of the control electrodes CG. FIGS. 12A to 12C are process views for explanation of one example of the method of manufacturing the nonvolatile semiconductor memory device shown in FIG. 11.

As shown in FIG. 11, the polycrystalline silicon film 13 which is the floating electrode FG is formed on the silicon oxide film 12 at the element region. The floating electrode FG is formed of only this polycrystalline silicon film 13. Moreover, a low dielectric constant silicon oxide film 35 which is the STI filling material is formed in the interior of the groove 17A which is the element isolation region. The width of the groove 17A which is the element isolation region is, for example, about 60 nm. Moreover, an alumina film 36 is formed on the top surfaces of the above-described polycrystalline silicon film 13 and the silicon oxide film 35. In the same way as described above, the alumina film 36 is an insulating material having a high dielectric constant.

As shown in FIG. 11, the floating electrode FG is formed of only the polycrystalline silicon film 13. On the other hand, the floating electrode FG according to the above-described first to third embodiments is formed of the polycrystalline silicon film 18 whose both ends project up to the groove 18A of the silicon oxide film 16 formed on the top surface thereof. However, if the interval of the nonvolatile memory elements CM which are adjacent along the control electrode CG is made small by miniaturization, there are cases in which it is difficult to use a structure as described above. This is because, if the above-described interval becomes small, there are cases in which the insulation performance between the nonvolatile memory elements CM which are adjacent along the control electrode CG cannot be sufficiently ensured.

However, in the present embodiment, the polycrystalline silicon film 13 is isolated by the low dielectric constant silicon oxide film 35 which is the element region, and the polycrystalline silicon film 13 does not project on the top surface of the silicon oxide film 35. Therefore, even when the interval of the adjacent nonvolatile memory elements MC becomes small, the insulation between the adjacent nonvolatile memory elements CM can be sufficiently ensured.

The low dielectric constant silicon oxide film 35 which is the STI filling material is formed in the interior of the groove 17A which will be an element isolation region. Therefore, the coupled capacities, not only between the adjacent floating electrodes, but also between the floating electrodes and the source/drain regions (not shown) which are active regions, and between the source region and the drain region (not shown), can be reduced. As a result, the above-described interference effect between the adjacent nonvolatile memory elements can be reduced.

Note that, in the same way as described above, the silicon oxide film 35 with a low dielectric constant is preferably an insulating material whose dielectric constant is as low as possible. A silicon oxide film formed by being deposited, for example, by the coating method, or the like, is applicable.

Moreover, if the material is a material whose dielectric constant is low, other insulating materials are also applicable.

Moreover, in the alumina film 36 formed on the top surface of the silicon oxide film 35, in the same way, an insulating material whose dielectric constant is high is preferable. Accordingly, for example, a $Ta_2O_5$ (tantalum oxide) film, a silicon nitride film, an ONO insulating film, or the like can be used.

Hereinafter, one example of the method of manufacturing the nonvolatile semiconductor memory device shown in FIG. 11 will be described by using FIGS. 12A to 12C.

First, in FIG. 12A, by the same method as in the first embodiment, on the main surface of the silicon substrate 11, after the groove 17A which will be an element isolation region is formed, the silicon oxide film 12, the polycrystalline silicon film 13, the silicon nitride film 14, the silicon oxide film 15, and the silicon oxide film 16, are successively formed. Thereafter, the low dielectric constant silicon oxide film 35 which is the STI filling material is formed by, for example, the coating method (or the CVD method).

Next, in FIG. 12B, the silicon oxide film 35 is flattened up to the surface of the silicon nitride film 14 by, for example, the CMP method, and is heated in a nitrogen atmosphere to about 900° C. Moreover, the silicon nitride film 14 is immersed in a buffered HF solution, and the silicon nitride film 14 is eliminated by phosphating at about 150° C. Next, the silicon oxide film 35 with a low dielectric constant is withdrawn by a dilute HF solution.

Subsequently, in FIG. 12C, the alumina film 36 is formed by, for example, the CVD method on the top surfaces of the polycrystalline silicon film 13 and the silicon oxide film 35 with a low dielectric constant. Hereinafter, the nonvolatile semiconductor memory device shown in FIG. 11 can be formed by the same manufacturing processes as in the first embodiment.

In the manufacturing method according to the embodiment, the filling material and the insulating film isolating the adjacent floating electrodes FG are simultaneously formed by the silicon oxide film 35 with a low dielectric constant. Therefore, the manufacturing processes are simplified, and the manufacturing cost can be reduced.

Further, the floating electrode FG is formed of only the polycrystalline silicon film 13. Therefore, the manufacturing processes are simplified, and the manufacturing cost can be reduced.

FIFTH EMBODIMENT

A fifth embodiment according to the present invention will be described by using FIGS. 13, and 14A to 14D.

Figure 13:
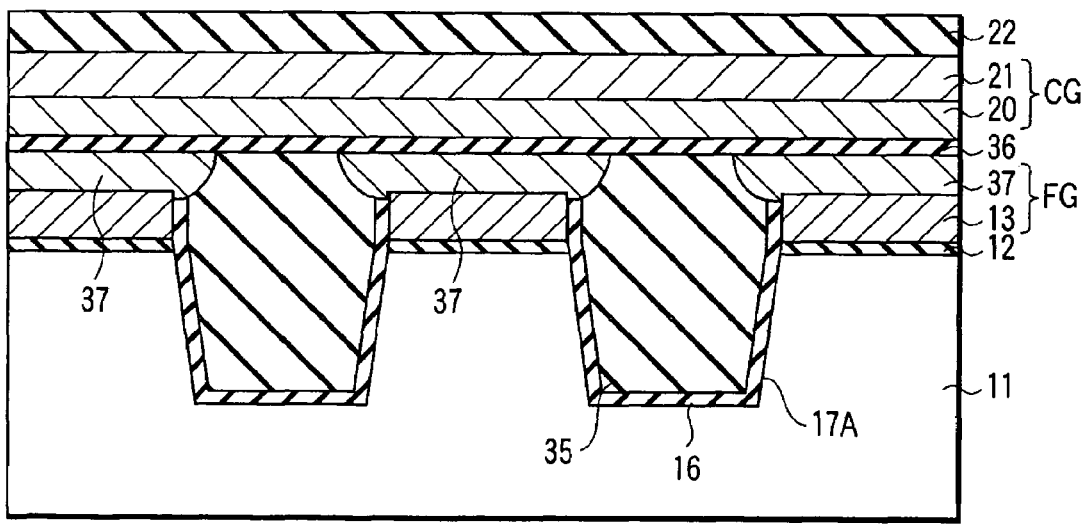
FIG. 13 is a cross-sectional structural view of a nonvolatile semiconductor memory device having floating electrodes according to a fifth embodiment of the present invention.

FIG. 13 is a cross-sectional structural view of the plurality of nonvolatile semiconductor memory device formed along the wiring longitudinal direction of the control electrodes CG. FIGS. 14A to 14D are process views for explanation of one example of the method of manufacturing the nonvolatile semiconductor memory device shown in FIG. 13.

As shown in FIG. 13, the silicon oxide film 35 with a low dielectric constant is formed in the interior of the groove 17A which is the element region isolation region. In the same way as described above, the silicon oxide film 35 is an insulating material having a low dielectric constant. A polycrystalline silicon film 37 whose both end portions project along the direction of the control electrode CG in the interior of the silicon oxide film 35 is formed on the surface of the polycrystalline silicon film 13. The floating electrode is formed of the two layers of the polycrystalline silicon film 37 and the polycrystalline silicon film 13. Moreover, the alumina film 36 is formed along the direction of the control electrode CG on the top surfaces of the silicon oxide film 35 with a low dielectric constant and the polycrystalline silicon film 37. In the same way as described above, the alumina film 36 is an insulating material having a high dielectric constant.

The above-described polycrystalline silicon film 37 is formed so as to be a form in which both end portions thereof project along the direction of the control electrode CG in the interior of the silicon oxide film 35 on the surface of the polycrystalline silicon film 13. Therefore, the surface area facing the control electrode CG can be made to be large. As a result, due to the capacitive coupling ratio being increased, the threshold voltage applied to the control electrode CG can be reduced.

The silicon oxide film 35 with a low dielectric constant is formed in the interior of the groove 17A which will be the element region isolation region. Accordingly, the coupled capacity of the adjacent floating electrodes FG can be reduced.

The alumina film 36 having a high dielectric constant is formed along the direction of the control electrode CG on the surfaces of the silicon oxide film 35 and the polycrystalline silicon film 37. As a result, due to the coupled capacity between the control electrode CG and the floating electrode FG being increased, the threshold voltage applied to the control electrode CG can be reduced.

Note that, in the same way as described above, the silicon oxide film 35 with a low dielectric constant is preferably an insulating material whose dielectric constant is low, and a silicon oxide film formed by being deposited, for example, by the coating method, or the like, is applicable. Moreover, if the material is a material whose dielectric constant is low, other insulating materials are also applicable.

Moreover, in the above-described alumina film 36 formed on the top surface of the silicon oxide film 35, in the same way, an insulating material whose dielectric constant is high is preferable. Accordingly, for example, a $Ta_2O_5$ (tantalum oxide) film, a silicon nitride film, an ONO insulating film, or the like can be used.

Hereinafter, one example of the method of manufacturing the nonvolatile semiconductor memory device shown in FIG. 13 will be described by using FIGS. 14A to 14D.

Figure 14A:
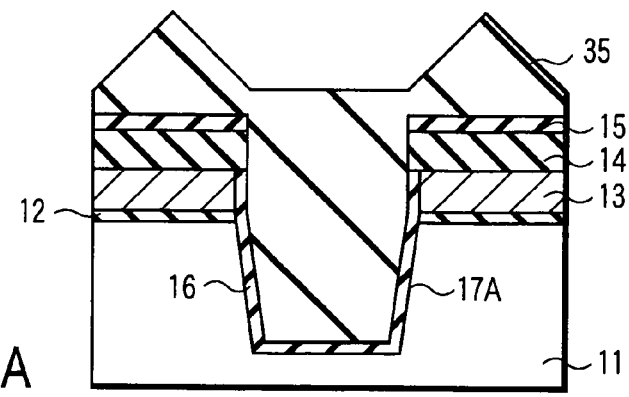
FIG. 14A is a first process view for explanation, with respect to the cross-sectional structure shown in FIG. 13, of one example of a method of manufacturing the nonvolatile semiconductor memory device according to the fifth embodiment of the present invention.

First, in FIG. 14A, by the same method as in the first embodiment, on the main surface of the silicon substrate 11, after the groove 17A which will be an element isolation region is formed, the silicon oxide film 12, the polycrystalline silicon film 13, the silicon nitride film 14, the silicon oxide film 15, and the silicon oxide film 16, are successively formed. Thereafter, the low dielectric constant silicon oxide film 35 which will be the STI filling material is formed by, for example, the coating method.

Figure 14B:
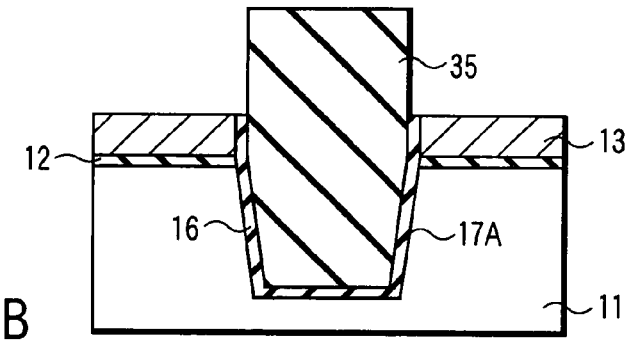
FIG. 14B is a second process view for explanation, with respect to the cross-sectional structure shown in FIG. 13, of one example of the method of manufacturing the nonvolatile semiconductor memory device according to the fifth embodiment of the present invention.

Next, in FIG. 14B, by using the silicon nitride film 14 as a stopper, the silicon oxide film 35 with a low dielectric constant is flattened to the surface of the silicon nitride film 14 by, for example, the CMP method, and is heated in a nitrogen atmosphere to about 900° C. Further, the silicon nitride film 14 is immersed in a buffered HF solution, and the silicon nitride film 14 is eliminated by phosphating at about 150° C.

Figure 14C:
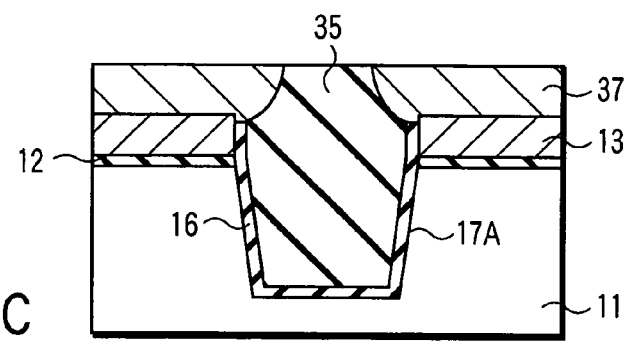
FIG. 14C is a third process view for explanation, with respect to the cross-sectional structure shown in FIG. 13, of one example of the method of manufacturing the nonvolatile semiconductor memory device according to the fifth embodiment of the present invention.

Next, in FIG. 14C, the silicon oxide film 35 with a low dielectric constant is isotropically made to withdraw by a dilute HF solution.

In addition, the polycrystalline silicon film 37 is formed so as to be deposited on the entire surface by, for example, the CVD method. Moreover, the silicon oxide film 35 and the polycrystalline silicon film 37 are flattened by, for example, the CMP method.

Figure 14D:
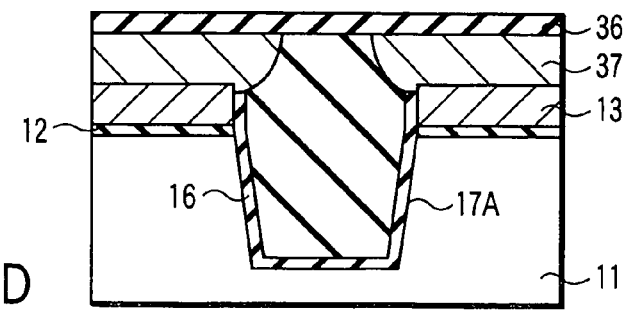
FIG. 14D is a fourth process view for explanation, with respect to the cross-sectional structure shown in FIG. 13, of one example of the method of manufacturing the nonvolatile semiconductor memory device according to the fifth embodiment of the present invention.

Next, in FIG. 14D, the alumina film 36 is formed by, for example, the CVD method on the top surfaces of the polycrystalline silicon 37 and the silicon oxide film 35 with a low dielectric constant. Thereafter, the nonvolatile semiconductor memory device shown in FIG. 13 can be formed by the same manufacturing processes as in the first embodiment.

In the manufacturing method according to the embodiment, both end portions of the silicon oxide film 35 are eliminated such that the central portion of the silicon oxide film 35 remains. Further, the polycrystalline silicon film 37 is formed so as to be deposited on the entire surface by, for example, the CVD method. Furthermore, the silicon oxide film 35 and the polycrystalline silicon film 37 are flattened by, for example, the CMP method. In this way, a structure in which both ends of the polycrystalline silicon film 37 project can be formed in a self-aligned manner. As a result, even when the width of the groove 17A isolating the floating electrode FG is narrow, a structure in which the polycrystalline silicon film 37 projects can be formed. As described above, due to the structure in which the polycrystalline silicon film 37 projects, the capacitive coupling between the floating electrode FG and the control electrode CG can be increased.

SIXTH EMBODIMENT

A sixth embodiment according to the present invention will be described by using FIGS. 15, and 16A to 16D.

FIG. 15 is a cross-sectional structural view of the plurality of nonvolatile semiconductor memory device formed along the wiring longitudinal direction of the control electrodes CG. FIGS. 16A to 16D are process views for explanation of one example of the method of manufacturing the nonvolatile semiconductor memory device shown in FIG. 15.

As shown in FIG. 15, a top surface of a silicon oxide film 38 with a low dielectric constant is formed so as to be higher than the top surface of the polycrystalline silicon film 18 in the interior of the groove 17A which will be the element region isolation region. The silicon oxide film 38 is an insulating material having a low dielectric constant. An alumina film 39 is formed along the direction of the control electrode CG on the top surfaces of the low dielectric constant silicon oxide film 38 and the polycrystalline silicon film 18. The alumina film 39 is an insulating material having a high dielectric constant.

The top surface of the silicon oxide film 38 with a low dielectric constant is formed so as to be higher than the top surface of the polycrystalline silicon film 18 which is adjacent thereto in the interior of the groove 17A which will be the element region isolation region. Accordingly, the control electrode CG does not enter the interior of the groove 17A. As a result, converging of the electric field at the corner of the floating electrode can be avoided. Moreover, the silicon oxide film 38 is formed of a low dielectric constant insulating film. Accordingly, the coupled capacity between the adjacent floating electrodes FG can be reduced. In accordance with the structure of the silicon oxide film 38 as described above, the reliability of the nonvolatile memory element can be improved more. Therefore, even if the width of the groove 17A is, for example, less than or equal to about 100 nm, it can be applied to the present embodiment.

Moreover, the alumina film 39 having a high dielectric constant is formed along the direction of the control electrode CG on the surfaces of the silicon oxide film 38 and the polycrystalline silicon film 18. Consequently, due to the coupled capacity between the control electrode CG and the floating electrode FG being increased, the voltage applied to the control electrode CG can be reduced.

Note that, in the same way as described above, the silicon oxide film 38 with a low dielectric constant is preferably an insulating material whose dielectric constant is low, and a silicon oxide film formed by being deposited, for example, by the coating method, or the like, is applicable. Further, if the material is a material whose dielectric constant is low, other insulating materials are also applicable.

Moreover, in the above-described alumina film 39 formed on the top surface of the silicon oxide film 38, in the same way, an insulating material whose dielectric constant is high is preferable. Accordingly, for example, a $Ta_2O_5$ (tantalum oxide) film, a silicon nitride film, an ONO insulating film, or the like can be used.

Hereinafter, one example of the method of manufacturing the nonvolatile semiconductor memory device shown in FIG. 15 will be described by using FIGS. 16A to 16D.

Figure 16A:
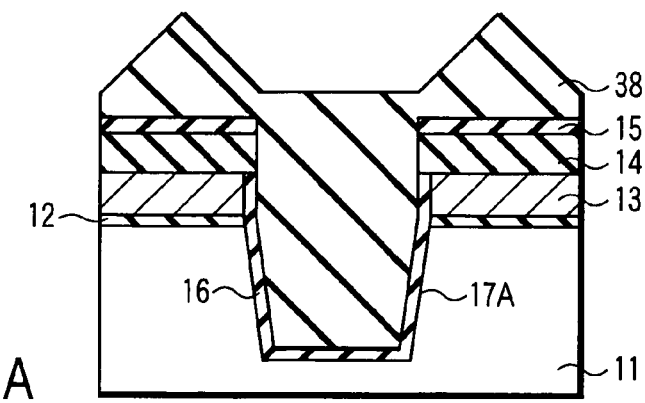
FIG. 16A is a first process view for explanation, with respect to the cross-sectional structure shown in FIG. 15, of one example of a method of manufacturing the nonvolatile semiconductor memory device according to the sixth embodiment of the present invention.

First, in FIG. 16A, by the same method as in the first embodiment, on the main surface of the silicon substrate 11, after the groove 17A which will be an element isolation region is formed, the silicon oxide film 12, the polycrystalline silicon film 13, the silicon nitride film 14, the silicon oxide film 15, and the silicon oxide film 16 are successively formed. Thereafter, the low dielectric constant silicon oxide film 38 which is the STI filling material is formed by, for example, the coating method.

Figure 16B:
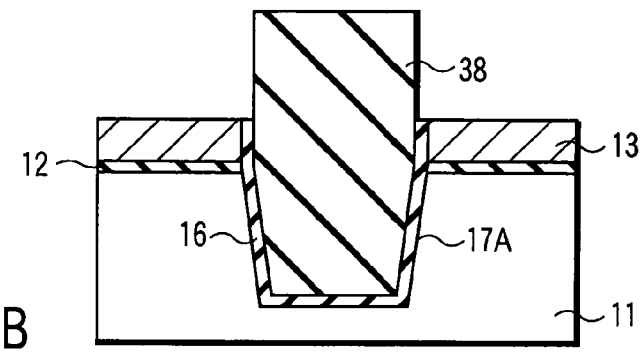
FIG. 16B is a second process view for explanation, with respect to the cross-sectional structure shown in FIG. 15, of one example of the method of manufacturing the nonvolatile semiconductor memory device according to the sixth embodiment of the present invention.

Next, in FIG. 16B, by using the silicon nitride film 14 as a stopper, the silicon oxide film 38 with a low dielectric constant is flattened to the surface of the silicon nitride film 14 by, for example, the CMP method, and is heated in a nitrogen atmosphere to about 900° C. Moreover, the silicon nitride film 14 is immersed in a buffered HF solution, and the silicon nitride film 14 is eliminated by phosphating at about 150° C.

Figure 16C:
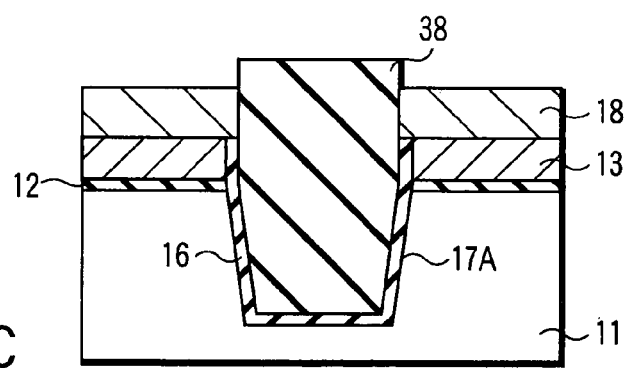
FIG. 16C is a third process view for explanation, with respect to the cross-sectional structure shown in FIG. 15, of one example of the method of manufacturing the nonvolatile semiconductor memory device according to the sixth embodiment of the present invention.

Then, in FIG. 16C, the polycrystalline silicon film 18 is formed so as to be deposited on the entire surface by, for example, the CVD method. Moreover, by using the silicon oxide film 38 as a stopper, the silicon oxide film 38 and the polycrystalline silicon film 18 are flattened by, for example, the CMP method. One portion of the polycrystalline silicon film 18 is eliminated and is made become to hollow by, for example, RIE method. In this way, a structure in which the top surface of the silicon oxide film 38 is higher than the top surface of the polycrystalline silicon film 18 is formed.

Figure 16D:
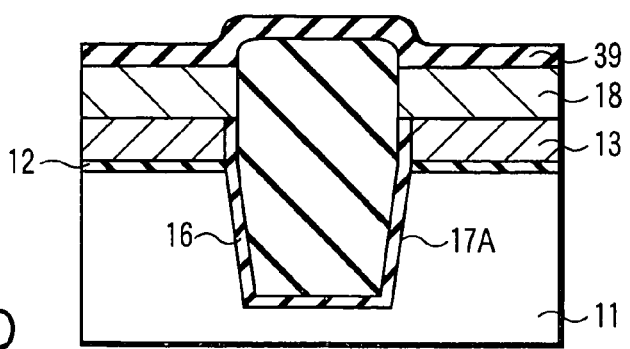
FIG. 16D is a fourth process view for explanation, with respect to the cross-sectional structure shown in FIG. 15, of one example of the method of manufacturing the nonvolatile semiconductor memory device according to the sixth embodiment of the present invention.

Subsequently, in FIG. 16D, the alumina film 39 is formed on the top surfaces of the polycrystalline silicon 18 and the low dielectric constant silicon oxide film 38 by, for example, the CVD method. Thereafter, the nonvolatile semiconductor memory device shown in FIG. 15 can be formed by the same manufacturing processes in the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
a first conductive type semiconductor substrate including a plurality of trenches formed on a main surface of the semiconductor substrate;
a plurality of nonvolatile memory elements formed on element regions respectively isolated by element isolation films formed in the trenches;
the nonvolatile semiconductor memory elements comprising:
a gate insulating film formed on the main surface of the semiconductor substrate;
a plurality of floating electrodes formed along a first direction on the gate insulating film, the plurality of floating electrodes adjacent to each other along the first direction being electrically isolated by a plurality of grooves on the element isolation films;
groove insulating films filled in said plurality of the grooves;
a plurality of second conductive type impurity diffusion regions formed along a second direction so as to sandwich the floating electrodes;
interelectrode insulating films formed along the first direction on the plurality of floating electrodes and the groove insulating films; and
control electrodes formed on the interelectrode insulating films,
wherein a width of one of the plurality of grooves is less than or equal to 1.6 times a film thickness of one of the interelectrode insulating films.

2. The nonvolatile semiconductor memory device according to claim 1, wherein the groove insulating films filled in said plurality of grooves are formed of the same insulating material as the interelectrode insulating films.

3. The nonvolatile semiconductor memory device according to claim 1, wherein the interelectrode insulating films and the groove insulating films include at least one of an oxide-nitride-oxide insulating film, a silicon oxide film, and a silicon nitride film.

4. The nonvolatile semiconductor memory device according to claim 1, wherein each of said plurality of floating electrodes has a two-layer structure which is formed of a first floating electrode layer formed on the gate insulating film, and a second floating electrode layer formed on the first floating electrode layer.

* * * * *